(12) United States Patent
Male et al.

(10) Patent No.: US 9,929,110 B1
(45) Date of Patent: Mar. 27, 2018

(54) INTEGRATED CIRCUIT WAVE DEVICE AND METHOD

(71) Applicant: TEXAS INSTRUMENTS INCORPORATED, Dallas, TX (US)

(72) Inventors: Barry Jon Male, West Granby, CT (US); Benjamin Cook, Addison, TX (US); Robert Alan Neidorff, Bedford, NH (US); Steve Kummerl, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/395,456

(22) Filed: Dec. 30, 2016

(51) Int. Cl.
| | |
|---|---|
| *H01L 31/0232* | (2014.01) |
| *H01L 23/66* | (2006.01) |
| *H01L 23/31* | (2006.01) |
| *H01L 21/56* | (2006.01) |
| *G02B 27/09* | (2006.01) |
| *G02B 3/08* | (2006.01) |

(52) U.S. Cl.
CPC ............ *H01L 23/66* (2013.01); *G02B 3/08* (2013.01); *G02B 27/0955* (2013.01); *G02B 27/0977* (2013.01); *H01L 21/56* (2013.01); *H01L 23/3121* (2013.01)

(58) Field of Classification Search
CPC ... H01L 23/66; H01L 23/315; H01L 23/3192; G02B 27/0955; G02B 27/0977; G02B 3/08; G02B 3/12; B29C 67/0051; B29C 67/0092
See application file for complete search history.

(56) References Cited

U.S. PATENT DOCUMENTS

| | | |
|---|---|---|
| 4,007,978 A | 2/1977 | Holton |
| 4,267,484 A | 5/1981 | O'Loughlin |
| 4,272,753 A | 6/1981 | Nicolay |
| 5,389,578 A | 2/1995 | Hodson et al. |
| 5,929,514 A | 7/1999 | Yalamanchili |
| 6,365,433 B1 | 4/2002 | Hyoudo et al. |
| 6,507,264 B1 | 1/2003 | Whitney |
| 6,509,574 B2 | 1/2003 | Yuan et al. |
| 6,815,808 B2 | 11/2004 | Hyodo et al. |
| 6,977,468 B1 | 12/2005 | Baginski |
| 7,015,587 B1 | 3/2006 | Poddar |
| 7,321,162 B1 | 1/2008 | Lee et al. |
| 7,732,892 B2 | 6/2010 | Jeng et al. |
| 7,842,542 B2 | 11/2010 | Shim et al. |

(Continued)

FOREIGN PATENT DOCUMENTS

EP 1986297 A2 10/2008

OTHER PUBLICATIONS

OSRAM Opto Semiconductors GmbH, Oslon Compact (850nm), version 1.6, SFH 4710, dated Dec. 1, 2015 (13 pages).

(Continued)

*Primary Examiner* — Syed Gheyas
(74) *Attorney, Agent, or Firm* — Michael A. Davis, Jr.; Charles A. Brill; Frank D. Cimino

(57) ABSTRACT

A method of forming, and a resulting, an integrated circuit wave device. The method (i) affixes an integrated circuit die relative to a substrate; (ii) creates a form relative to the integrated circuit die and the substrate; and (iii) forms a wave shaping member having a shape conforming at least in part to a shape of the form.

21 Claims, 8 Drawing Sheets

(56) References Cited

U.S. PATENT DOCUMENTS

| | | | |
|---|---|---|---|
| 7,869,180 | B2 | 1/2011 | Cheung et al. |
| 8,018,705 | B2 | 9/2011 | Michalopoulos et al. |
| 8,436,460 | B1 | 5/2013 | Gamboa et al. |
| 8,569,082 | B2 | 10/2013 | Kummerl et al. |
| 8,633,551 | B1 | 1/2014 | Teh et al. |
| 9,184,012 | B2 | 11/2015 | Wang |
| 9,419,075 | B1 | 8/2016 | Carothers et al. |
| 2003/0183916 | A1 | 10/2003 | Heck et al. |
| 2004/0084729 | A1 | 5/2004 | Leung et al. |
| 2007/0076421 | A1* | 4/2007 | Kogo ............ B60Q 1/2696 362/540 |
| 2007/0229177 | A1 | 10/2007 | Moriya |
| 2008/0266730 | A1 | 10/2008 | Viborg et al. |
| 2010/0187652 | A1 | 7/2010 | Yang |
| 2011/0233790 | A1 | 9/2011 | Bchir |
| 2013/0134445 | A1* | 5/2013 | Tarsa ............. B29C 43/18 257/88 |
| 2013/0194057 | A1 | 8/2013 | Ruby |
| 2013/0320548 | A1 | 12/2013 | Carpenter et al. |
| 2013/0329324 | A1 | 12/2013 | Tziviskos et al. |
| 2014/0001632 | A1 | 1/2014 | Uehling et al. |
| 2014/0264905 | A1 | 9/2014 | Lee et al. |
| 2015/0035091 | A1 | 2/2015 | Liglioli |
| 2015/0069537 | A1 | 3/2015 | Lo et al. |
| 2015/0249043 | A1* | 9/2015 | Elian ............. H01L 21/4867 257/684 |
| 2015/0369681 | A1 | 12/2015 | Imai |
| 2015/0369682 | A1 | 12/2015 | Nakajima |
| 2015/0380353 | A1 | 12/2015 | Bauer et al. |
| 2016/0003436 | A1 | 1/2016 | Singer |
| 2016/0167089 | A1* | 6/2016 | Ng ............... B29C 67/0092 428/319.3 |
| 2016/0209285 | A1 | 7/2016 | Nakajima |
| 2017/0089789 | A1 | 3/2017 | Kanemoto |
| 2017/0134004 | A1 | 5/2017 | Isozaki |

OTHER PUBLICATIONS

Cameron G. Clark, "The Basics of Arc Flash," GE Industrial Solutions web site accessed Oct. 5, 2016, http://apps.geindustrial.com/publibrary/checkout/ArcFlash4?TNR=White%20Papers%7CArcFlash4%7Cgeneric (3 pages).

National Semiconductor Corporation, "Semiconductor Packaging Assembly Technology," National Semiconductor Corporation, Aug. 1999, pp. 1-8.

Cook, et al.: "Floating Die Package"; U.S. Appl. No. 15/248,151, filed Aug. 26, 2016; 34 pages.

Maloberti, F., "Layout of Analog CMOS Integrated Circuit, Part 2 Transistors and Basic Cells Layout," retrieved from http://ims.unipv.it/Courses/download/AIC/Layout02.pdf, dated Mar. 15, 2004 (38 pages).

Texas Instruments Product Brochure ISO7841x High-Performance, 8000-Vpk Reinforced Quad-Channel Digital Isolator, dated Nov. 2014 (37 pages).

Texas Instruments Application Report "The ISO72x Family of High-Speed Digital Isolators," SLLA198—Jan. 2006 (12 pages).

Texas Instruments Developers Guide "Digital Isolator Design Guide," SLLA284A, Jan. 2009 (19 pages).

Wikipedia article "3D Printing," retrieved from "http://en.wikipedia.org/w/index.php?title=3D_printing&oldid=624190184", dated Sep. 4, 2014 (35 pages).

International Search Report for PCT/US2017/031987 dated Sep. 7, 2017.

\* cited by examiner

INTEGRATED CIRCUIT WAVE DEVICE AND METHOD

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The preferred embodiments relate to an integrated circuit wave device and the method of manufacturing it, where the product may be a transmitter, receiver, transceiver, emitter, or detector operable in connection with emitting or detecting waves (e.g., electromagnetic waves; pressure waves; etc.), and where the waves may be within a bandwidth selected from various ranges, such as from radio frequency to ultraviolet (i.e., through the visible spectrum and beyond).

Integrated circuit wave devices have myriad functions and applications, and may be generally categorized by virtue of the bandwidth of waves communicated either to, or from, the device. Typically, such a device is formed as an integrated circuit package, with a part of the package including one or more elements for either detecting or emitting a wave. More specifically, an integrated circuit package typically includes one or more semiconductor chips (or "dies") that are affixed relative to one another and to a substrate in some type of casing, which is often a metal, plastic, glass or ceramic, and where the casing inclusive of what it encloses is referred to as a whole as the package. Thus, a die or dies includes the wave transmitting or receiving element(s), hereafter referred to as a communication element. For example, radio frequency (RF) or infrared (IR) communication elements may be used to wirelessly transmit signals, in numerous applications. As another example, IR communication elements may be used in imaging or motion detection. In still another example, communication elements may be used for power measurements. Numerous other examples are known in the art. In any event, the operation and efficacy of the device is based in part on the proper communication of the wave to/from the communication element, so it is known in the art that sufficiently directing the wave with respect to the element is important.

According to the prior art, wave directing apparatus, including either lenses or reflectors, may be positioned external from the package, but relative to its communication element. Such lenses or reflectors improve signal strength, for example by focusing waves and also in connection with either sensing directionality or beam forming in a known output direction. While such approaches can improve signal performance, they also have potential drawbacks. For example, the positioning and affixation of wave directing apparatus requires additional manufacturing steps beyond the construction of the package itself. As another example, components external from the package, including these wave directing apparatus, are more readily susceptible to being damaged or displaced as they are not necessarily protected in the same manner as components encapsulated within the package. Still other examples are known in the art. Thus, while the prior art approaches have served various needs, the present inventors seek to improve upon the prior art, as further detailed below.

BRIEF SUMMARY OF THE INVENTION

In a preferred embodiment, there is a method of forming an integrated circuit wave device. The method comprises: (i) affixing an integrated circuit die relative to a substrate; (ii) creating a form relative to the integrated circuit die and the substrate; and (iii) forming a wave shaping member having a shape conforming at least in part to a shape of the form.

Numerous other inventive aspects are also disclosed and claimed.

DETAILED DESCRIPTION OF EMBODIMENTS

Figure 1:
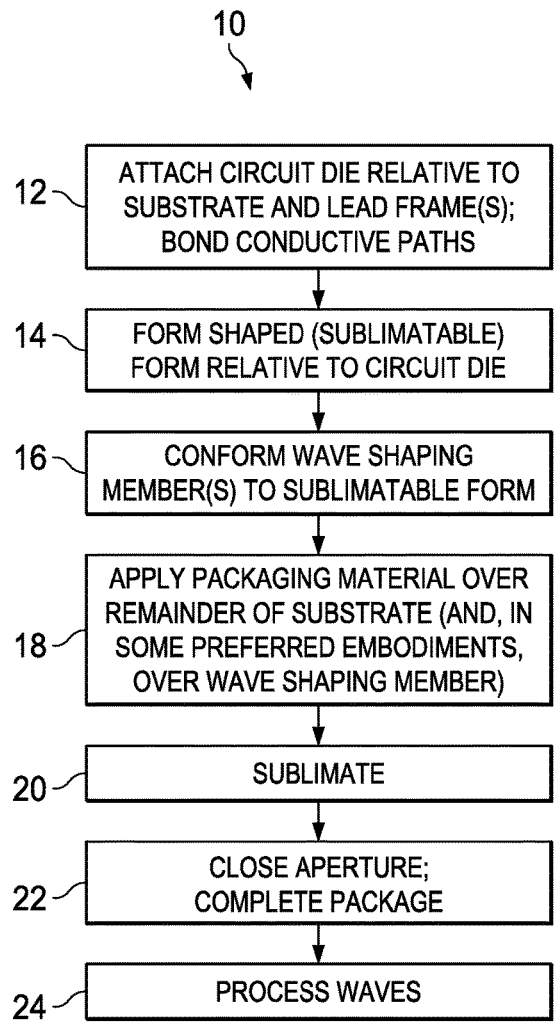
FIG. 1 illustrates a preferred embodiment method for creating and operating a wave device according to preferred embodiments.

By way of introduction, the preferred embodiments relate to an integrated circuit wave device and the method of manufacturing it. In this regard, FIG. 1 illustrates various steps of such a method 10, while FIGS. 2A through 7 illustrate the integrated circuit wave device 100 in various views and stages of the product formation. Numerous aspects of integrated circuit fabrication and packaging are well known by, or ascertainable to, one skilled in the art, and in order to simplify the reader's understanding, such aspects are therefore not detailed herein. By way of example, however, additional details with respect to such aspects may be found in co-owned U.S. patent application Ser. No. 15/248,151, entitled "Floating Die Package," filed Aug. 26, 2016, and which is hereby incorporated herein by reference.

Figure 2B:
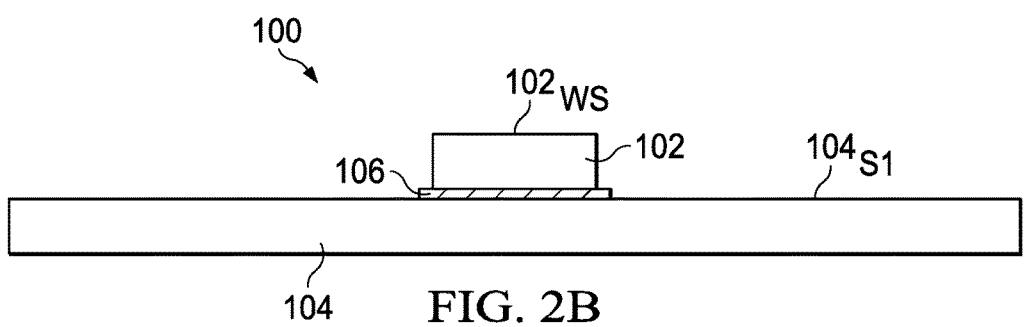
FIG. 2B illustrates a cross-sectional view of FIG. 2A.
Figure 2A:
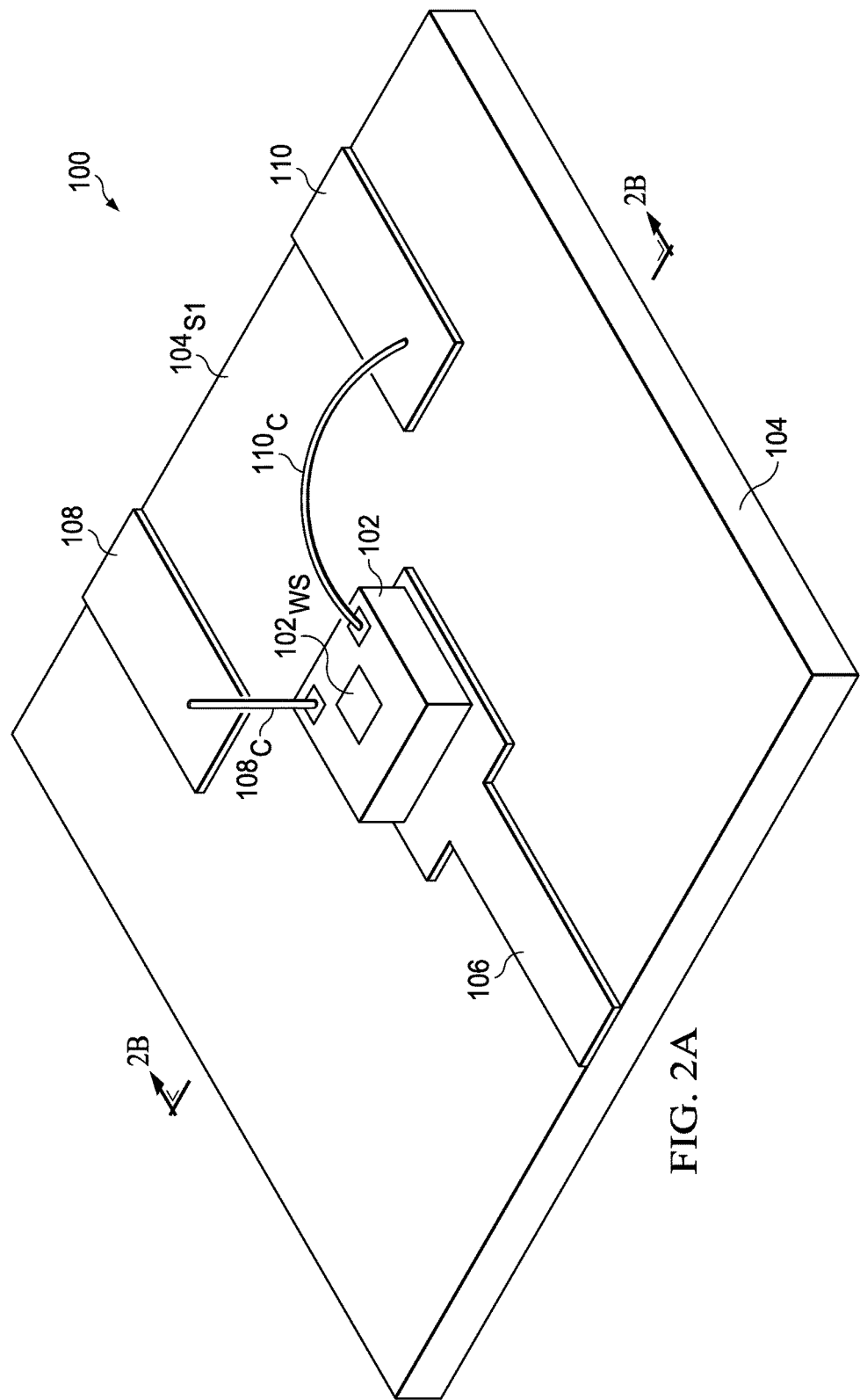
FIG. 2A illustrates a perspective view of various components of a wave device according to one preferred embodiment.

In FIG. 1, method 10 is shown with a first step 12, which is necessarily preceded by various additional method steps as known in the art, where the preceding steps form or provide various components that are shown in FIG. 2A. In this regard, FIG. 2A illustrates a perspective view of various components of wave device 100. In step 12, a circuit die 102 is attached relative to a first surface $104_{S1}$ of a substrate 104. Circuit die 102 may be of various types, and for purposes of the preferred embodiment includes apparatus and functionality for either transmitting/emitting or receiving/detecting (or both) a wave (i.e., either a signal or noise), the wave being of a particular device bandwidth referred to herein as $BW_D$. Further in this regard, therefore, die 102 is shown to include a wave surface $102_{WS}$ for either transmitting/emitting or receiving/detecting the wave. Note also that while one die with one communication surface is shown and described, alternative preferred embodiments may include either multiple die (e.g., in an array) or multiple communication surfaces per the one or more die.

Substrate 104 is constructed of various materials, and one consideration in the present preferred embodiment is that the material of substrate 104 be selected in anticipation of the type and/or bandwidth $BW_D$ of the wave that is communicated relative to device 100. Specifically, the substrate 104 material is selected to readily permit the wave to transmit through substrate 104 with little or no change in the signal direction or strength, that is, the substrate material does not have strong absorbance (i.e., at most a negligible effect) in the bandwidth $BW_D$ of interest so that a substantial portion of the wave passes through the material. For example, where the bandwidth $BW_D$ is in the visible spectrum in that the anticipated wave is visible light, then preferably the material for substrate 104 is transparent to the passage of the signal (i.e., the light). As will be apparent later, such transmission of the wave signal through the material of substrate 104 is desired so as to ultimately be communicated to/from wave surface $102_{WS}$.

The attachment of step 12 may be of various techniques and may involve additional structure, with FIG. 2A illustrating one example. In this regard, affixed to an upper surface of substrate 104 is a first lead frame 106. Step 12 affixes circuit die 102 so that it is adjacent lead frame 106, as is further shown in FIG. 2B. Specifically, FIG. 2B illustrates a cross-sectional view of FIG. 2A (along line 2B therein), from which it is apparent that lead frame 106 is between a first surface $104_{SI}$ of substrate 104 and die 102. As also shown in FIG. 2A, additional lead frames 108 and 110 may be affixed to substrate 104, where these lead frames provide electrical connectivity points relative to die 102. Further in this regard, step 12 also includes the connection of conductors $108_C$ and $110_C$ (e.g., bond wires) as between each lead frame 108 and 110 to a respective conductive pad on die 102.

Figure 3A:
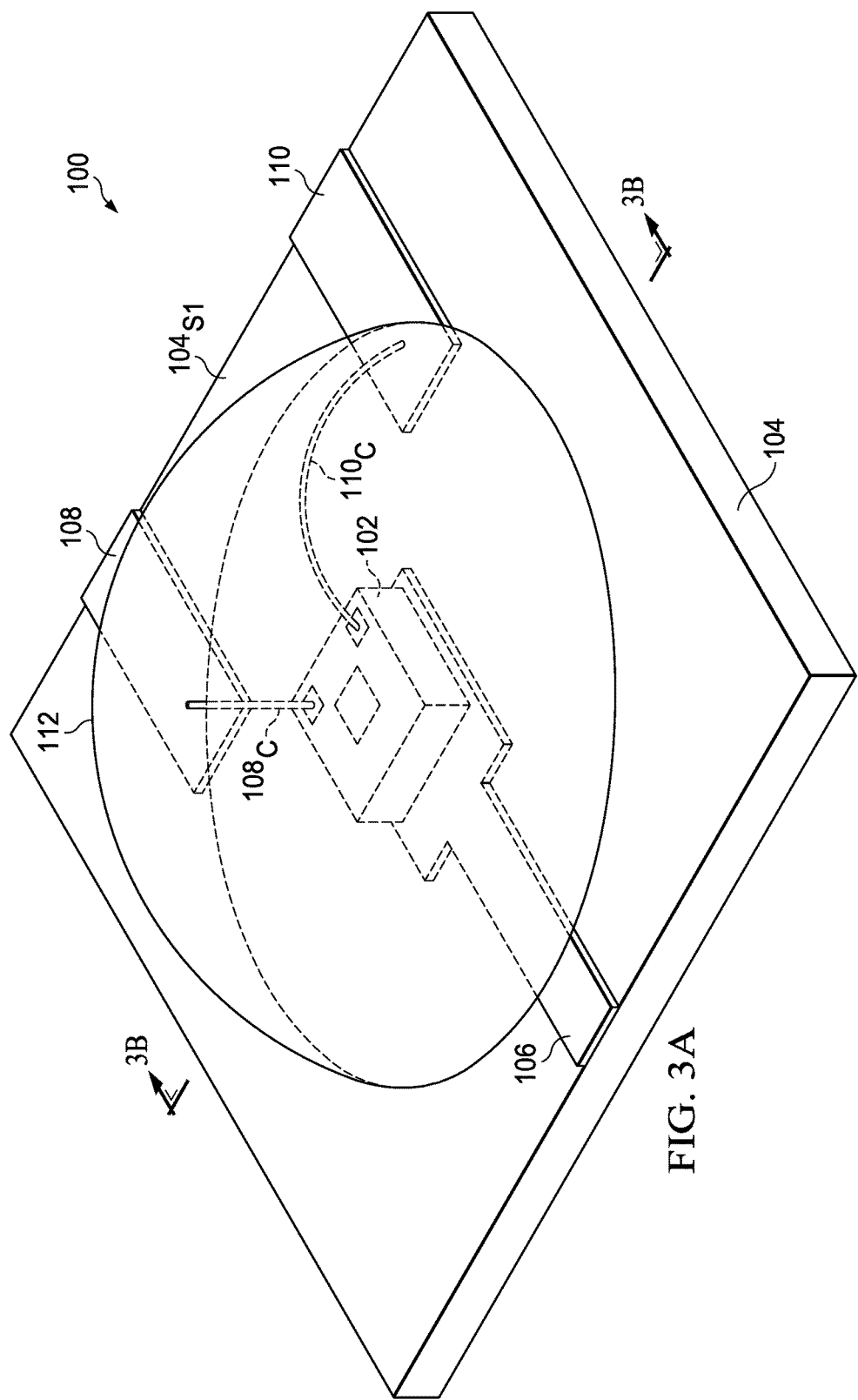
FIG. 3A illustrates the perspective view of FIG. 2A after additional processing.
Figure 3B:
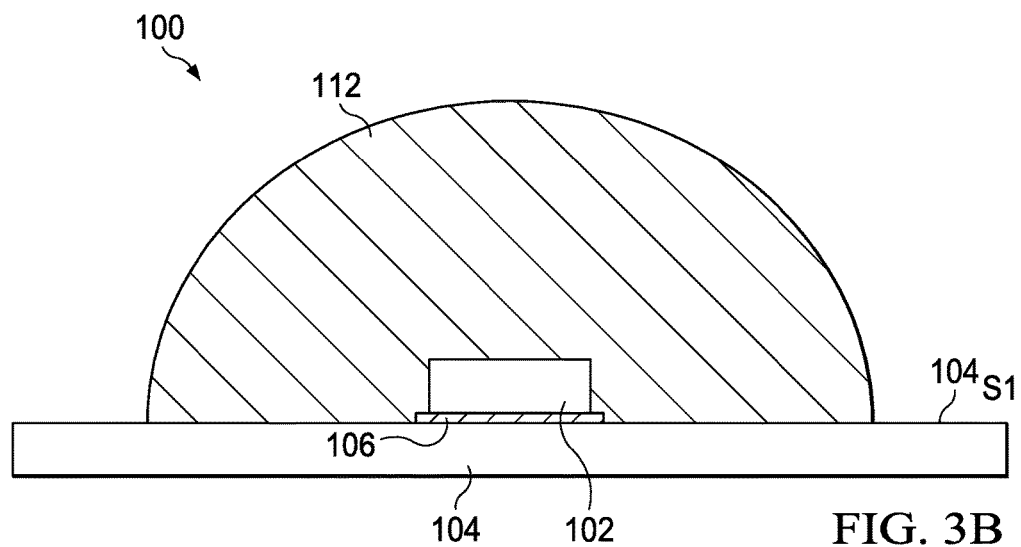
FIG. 3B illustrates a cross-sectional view of FIG. 3A.
Figure 4:
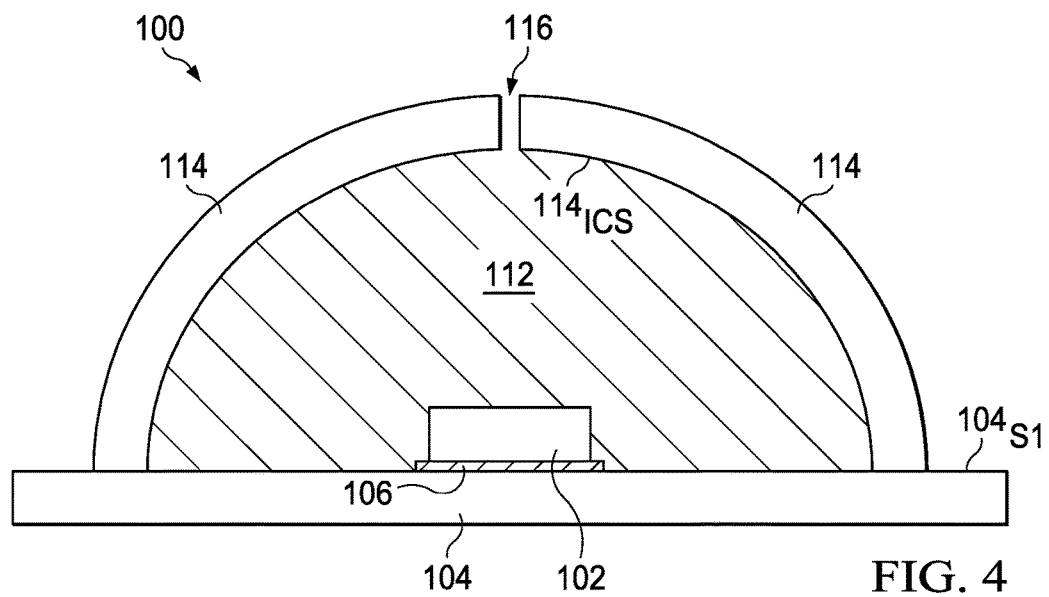
FIG. 4 illustrates the cross-sectional view of FIG. 3B after additional processing.

Returning to FIG. 1 and method 10, a step 14 follows step 12, and in step 14 a shaped material form is formed relative to a region of circuit die 102; in various preferred embodiments, the shaped form is created using a sublimatable material, that is, a material that may be subsequently sublimated, whereas in other preferred embodiments alternative may be used, as described later. In regard to the use of a sublimatable material, and as detailed in the above-incorporated patent application Ser. No. 15/248,151, materials such as various types of polyols can sublimate or shrink/delaminate at temperatures outside the wire bonding process windows and molding process windows (described below). In that earlier patent application, such sublimation is used to leave a cavity within the package so as to alleviate certain structural stresses. In contrast, and as shown in the remainder of this document, in various preferred embodiments the sublimatable material provides a sublimatable form, where the term "form" is used in the sense of comparable structures such as a mold, cast, shape, or matrix, in that the form provides a precursor shape for forming an adjacent structure next to, or otherwise in conformance with at least a portion of the shape of, the form, as further appreciated below. To further appreciate step 14, FIG. 3A repeats the perspective view illustration of FIG. 2A, and FIG. 3B repeats the cross-sectional view illustration of FIG. 2B, but after the step 14 form described in FIG. 1 is formed. In the example of FIG. 3A, the step 14 form is shown as a hemispherical form 112. Preferably, hemispherical form 112 fully surrounds circuit die 102 (items covered by form 112 are shown with dashed lines in FIG. 3A), and otherwise is formed in part above lead frames 106, 108, and 110, thereby also covering conductors $108_C$ and $110_C$. Note that depending on the physical/chemical properties of the polyols and applicable process temperature windows, the selected sublimatable materials for form 112 may be applied as solids that can be extruded as a melting bead at certain temperatures for depositing over select portions of the die/substrate/bond wires. In another variation, the sublimatable materials may be dissolved in suitable solvents and applied as a solution of appropriate viscosity using a syringe dispensing mechanism that dispenses a bead over the die portions as well as surrounding substrate and bond wire portions (hereinafter referred to as "encapsulated components"). The solvent may be evaporated from the bead, thereby leaving a "glob" of the material over the circuit die 102. In yet another variation, a select sublimatable material may be applied as a liquid at room temperature, whereupon it may be cured by radiation (e.g., UV, IR, etc.) that creates cross-linking of chemical bonds to solidify as a bump. Lastly, note that the step 14 application or completion of hemispherical form 112 insofar as its sublimatable material is concerned also may involve a heat (e.g., cure/bake) stage or stages.

Returning to FIG. 1 and method 10, a step 16 follows step 14, and in step 16 a conforming wave shaping member (or plural members) is formed adjacent part or all of the sublimatable form created in step 14. For ease of illustration, a perspective view is not furthered herein, but FIG. 4 again illustrates the cross-sectional side view of FIG. 3B, with the addition of a wave shaping member 114, as created in step 14, formed adjacent sublimatable form 112. In the example illustrated, because wave shaping member 114 is hemispherical, then at least the inner edge of wave shaping member 114 conforms to a part or all of the shape of form 112 and, therefore, provides an inner concave surface $114_{ICS}$, and preferably parabolic, relative to integrated circuit die 102. Thus, in the illustrated example, wave shaping member 114 may be created by a conforming layer having a thickness, preferably uniform, positioned atop the entirety of sublimatable form 112. Further, member 114 is referred to as "wave shaping" in that the material used for member 114 is preferably one suited for altering the directionality of waves at the bandwidth $BW_D$. For example, therefore, if the bandwidth $BW_D$ is within the visible spectrum, then the material used for wave shaping member 114 is reflective to that spectrum, so that light impinging on the inner concave surface of member 114 will reflect inwardly in the direction of die 102; in this manner, therefore, the change in wave directionality is "wave shaping," as further evident below.

In another aspect of step 16 and wave shaping member 114, also in a preferred embodiment an aperture 116 (or multiple apertures) is created through member 114, so as to allow an air channel between the exterior of member 114 and the sublimatable material of sublimatable form 112. By way of example in FIG. 4 therefore, a single aperture 116 is shown, located near or at the upper apex of the curvature of member 114. The diameter of aperture 116 also may be selected by one skilled in the art and, for example, may be in the range of 0.1 to 100's of wavelengths. Note also that while aperture 116 is shown as part of the step 16 formation of the wave shaping member(s), in an alternative preferred embodiment the aperture(s) can be formed as a separate step, after forming the wave shaping member, such as cutting, drilling and the like, and with various tools for doing so (e.g., laser).

Figure 5:
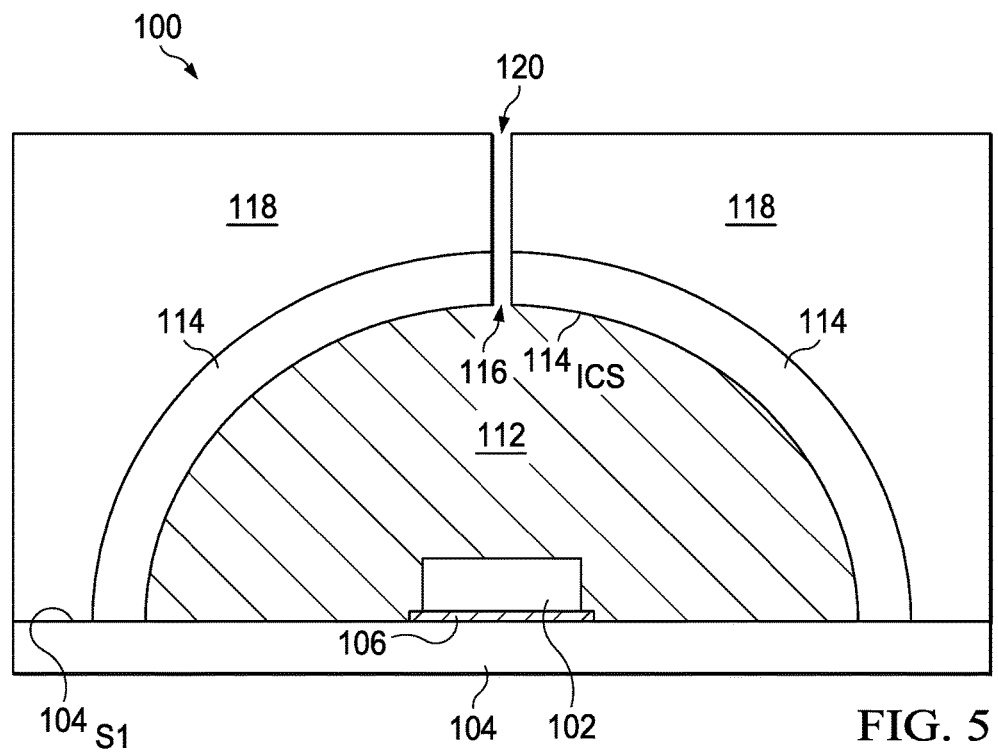
FIG. 5 illustrates the cross-sectional view of FIG. 4 after additional processing.

Returning to FIG. 1 and method 10, a step 18 follows step 16, and in step 18 an integrated circuit packaging material is applied over the device, preferably so as to encapsulate wave shaping member 114 and the remainder of the components affixed to substrate 104. To illustrate this step, FIG. 5 illustrates the cross-sectional side view of FIG. 4, with the addition of an encapsulating mold 118, formed according to step 18 by applying a select molding material over the desired circuit components. Note that additional steps may be required in connection with integrated circuit packaging. In any event, the molding materials may be selected from plastics, epoxy resins, etc. that may be formulated to contain various types of inorganic fillers such as fused silica, catalysts, flame retardants, stress modifiers, adhesion promoters, and other additives, preferably based on the specific product/part requirements, although other types of molding/packaging materials also may be used. In one example implementation, the select molding material may be applied by a packaging tool having a needle that is brought into contact with the wave shaping member 114, whereupon the select molding material is deposited around the needle, thereby also creating at least one aperture 120 in fluid (e.g., air) communication with aperture 116, where aperture 120 preferably has a dimension comparable to aperture 116. Typically, intense heat may be applied to the molding material, which may be liquefied and shaped into the desired structure. Also, the select molding material having aperture 120 may be cured in one or more stages in a mold cure process. In another example, film assist molding may be used whereby a film (or two films) is subjected to a vacuum so as to conform to a separable mold form and to thereby define a region into which thereafter a molding material is filled, whereby the film therefore isolates the mold from the molding material. Thus, after the molding material cures, the mold form is separable so as to release the encapsulated device that cured in the region, with the film having kept clean the mold form surfaces. In any event, with this process, aperture 120 may be realized as part of the film-protected mold form. In still another example, injection molding of many devices at once as an array or large contiguous mass may be used, followed by sawing or other technique to separate individual devices from the mold.

Figure 6:
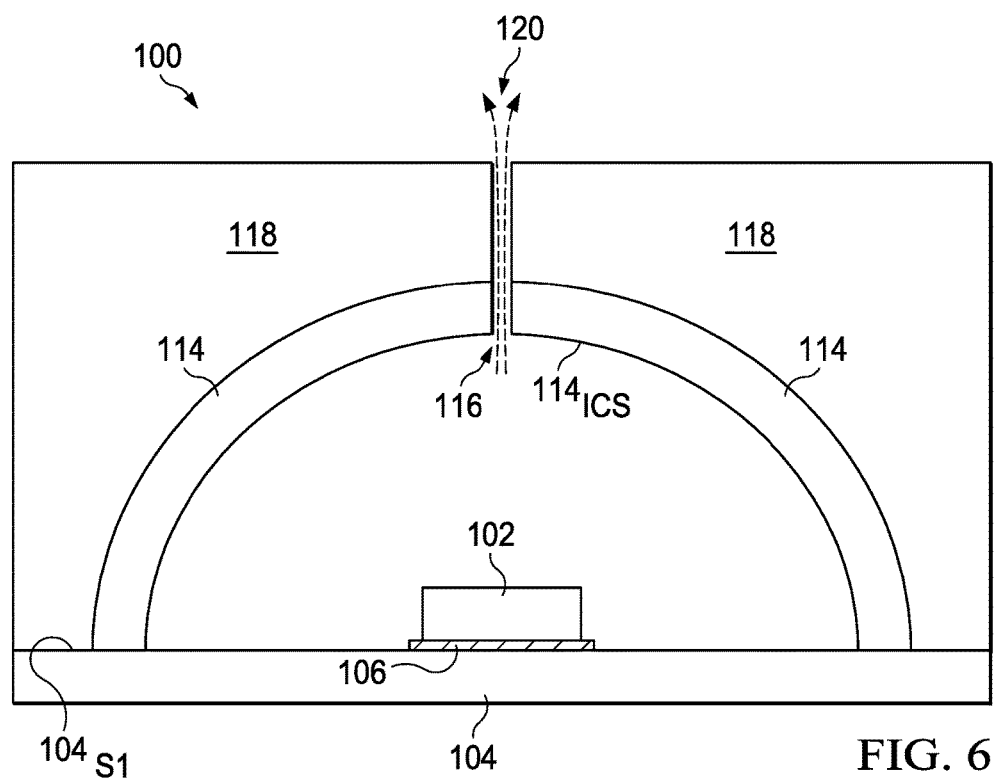
FIG. 6 illustrates the cross-sectional view of FIG. 5 after additional processing.

Returning to FIG. 1 and method 10, a step 20 follows step 18, and in step 20 the sublimated material from step 14 is sublimated, that is, the material is exposed to proper processes so as to transition the substance directly from the solid to the gas phase without passing through the intermediate liquid phase. To illustrate this step, FIG. 6 illustrates the cross-sectional side view of FIG. 5, where the patterned fill of the former material 112 in earlier Figures (i.e., from inside the concave shape of member 114) is shown as gone so as to represent both the phase change of the substance to gas and that, as a result from the sublimation processes, the resultant sublimated gas is exhausted through apertures 116 and 120, as shown by dotted arrows in the Figure. Given the steps and structure described thus far, therefore, an interior cavity remains on the concave side of wave shaping member 114, which may be occupied generally by the ambient material (e.g., air) remaining after the sublimated gas is exhausted from that area. Note that the sublimation may be achieved in various manners consistent with the type of sublimatable material used in the earlier step 14. For example, heat, radiation, or other phase-change energy or process(es) may be applied to gasify the sublimatable material of hemispherical form 112 at suitable temperatures (i.e., sublimation/evaporation), for example relative to typical backend packaging flow conditions.

Before proceeding, note that step 20 may be modified or omitted if a material or materials other than sublimatable are used for the step 14 formation of a shaped form. For example, the material used for the form in alternative preferred embodiments may be of a type to respond to a treatment (e.g., heat), whereby part of the material sublimates directly from solid phase to gas, while other parts transition from solid to liquid in step 20 so as to be removable (e.g., by flowing) through apertures 116 and 120, again as shown by dotted arrows in the FIG. 6. As still another alternative, step 20 (and others pertaining to aperture creation and closure) may be eliminated entirely in an alternative preferred embodiment wherein the step 14 form is created by a material that remains solid and is not removed via an aperture, which would be achieved by substituting in step 14 a material that remains as part of the final package and is of a type that does not substantially attenuate the bandwidth $BW_D$ of interest (e.g., clear polymer, where the bandwidth $BW_D$ is visible light).

Figure 7:
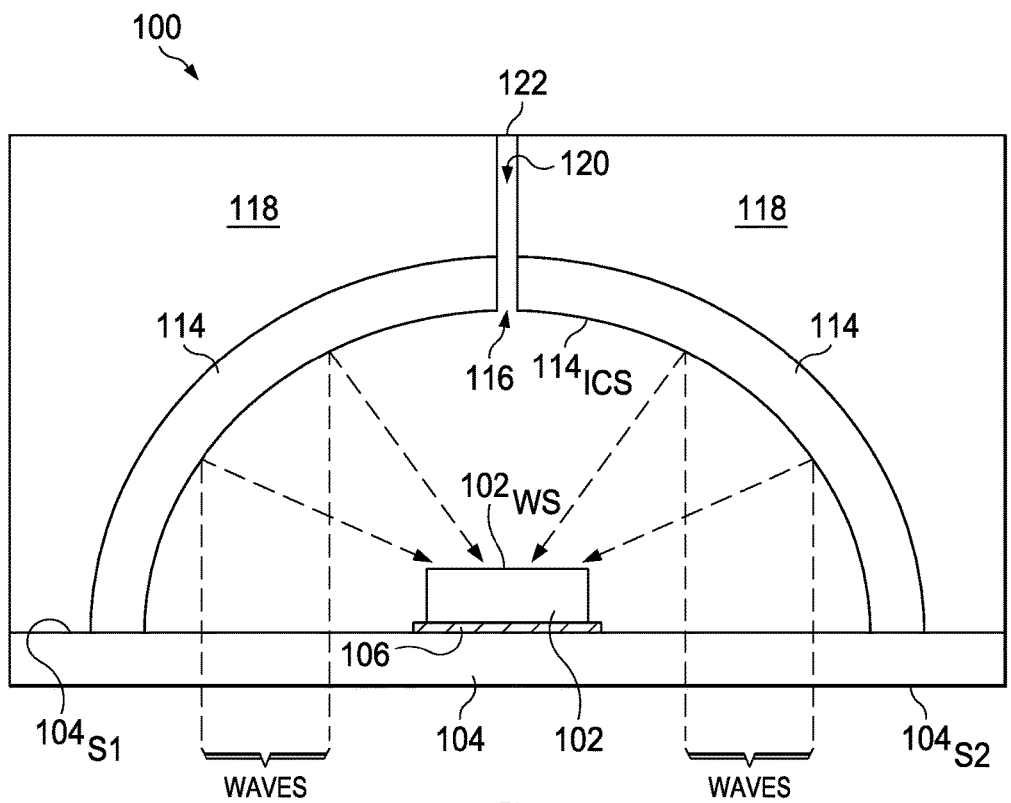
FIG. 7 illustrates the cross-sectional view of FIG. 6 after additional processing and in an operational illustration.

Returning to FIG. 1 and method 10, a step 22 follows step 20, and in step 22 a cover, seal, or other closure is formed over the step 18 aperture of the packaging material. To illustrate this step, FIG. 7 illustrates the cross-sectional side view of FIG. 6, where a cover 122 is formed over aperture 120, thereby enclosing any open area within the concavity of wave shaping member 114. Cover 122 may be formed in various manners. For example, aperture 120 may be covered or otherwise sealed with a film layer, such as one comprising a B-stage film or screen-printed encapsulant layer, and selection of a particular film layer to seal the package may depend on the size or shape of aperture 120. In general, therefore, step 22 completes the packaging of wave device 100, although additional processes could be added by one skilled in the art.

Completing FIG. 1, the final step 24 is shown to process waves. FIG. 7 also illustrates this step, which of course can occur in connection with testing and or later use of wave device 100. In the example of FIG. 7, therefore, waves are directed at a second surface $104_{S2}$ of substrate 104, which is opposite surface $104_{S1}$ to which circuit die 102 is affixed (directly, or via intermediate structure, such as lead frame 106). Recall that substrate 104 is preferably constructed of material(s) that permits the wave having a bandwidth $BW_D$ to pass through the substrate with reduced absorbance; as now may be appreciated, therefore, and as shown in FIG. 7, as the waves are directed to surface $104_{S2}$, the signals pass through substrate 104 and impinge upon the concave surface of wave shaping member 114. In the present example, the waves are light and wave shaping member 114 is a parabolic reflector, so as a result the directionality of the incoming waves (or rays) is reflected to a different direction. In this regard, therefore, it now may be appreciated that the earlier sublimatable form 112 is shaped and dimensioned so that the confirming and resulting wave shaping member 114 will provide a desired change in directionality of the incoming wave, which in the present embodiment is a reflective angle of incidence toward wave surface $102_{WS}$, as shown in FIG. 7. Moreover, note that once waves are reflected as described, they pass from the reflector to wave surface $102_{WS}$ via the communication channel of air that remains inside the concave region of member 114, with that channel having been earlier evacuated of the sublimatable material/gas. As a result, the reflected signal experiences zero loss, as the air through which it passes is a zero loss material. Lastly, while the directionality of the waves is shown in FIG. 7 for wave device 10 receiving a signal, if instead wave surface $102_{WS}$ provides a transmitting functionality, then the signal directionality is reversed, while the other benefits described above are still achieved. In other words, in such an instance, wave surface $102_{WS}$ may operate to transmit waves toward the inner concave surface $114_{ICS}$ of member 114 in which case such waves would then be reflected toward surface $104_{S1}$ of substrate 104 and then through substrate 104, thereby providing a directional transmission of such waves, for example, toward or in the direction of an intended target or receiving device.

Given the preceding, a preferred embodiment methodology and structure is provided resulting in a semiconductor wave device with an integrated wave signal directionality feature, so as to improve manufacturability, device longevity, and so as to efficiently communicate energy from the wave signal to/from the receiver/transmitter of the wave device. Note that the above-described preferred embodiment is just one example of the inventive scope, as still other wave shaping members may be situated, relative to one more integrated circuit die, as formed adjacent, or in conformity with, a sublimatable form that is subsequently sublimated leaving the wave shaping member affixed and encapsulated in the wave device package. Further in this regard, an additional preferred embodiment is described below, and still others will be ascertainable to one skilled in the art given the teachings of this document.

Figure 8:
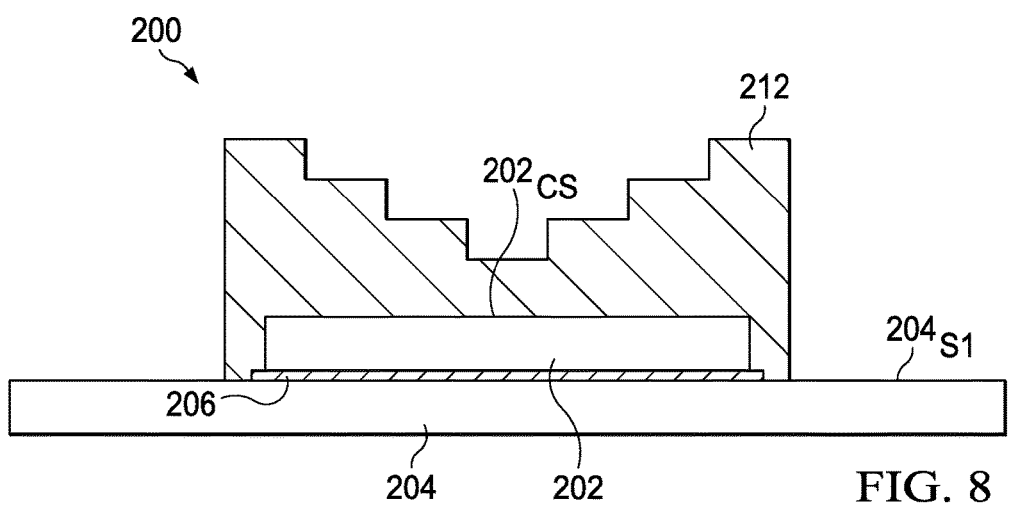
FIG. 8 illustrates a cross-sectional view of an alternative preferred embodiment wave device.

FIG. 8 illustrates a cross-sectional view of an alternative preferred embodiment wave device 200, which also may be constructed according to method 10 of FIG. 1 but results in various different structural aspects. Accordingly, the reader is assumed familiar with the earlier discussion, as steps relating to method 10 will hereafter be generally referenced, with additional details provided earlier. Also by way of introduction, note that the remaining illustrations and discussions are taught using cross-sectional views, as one skilled in the art will readily appreciate the overall device also in three dimensions, given the earlier illustrations and discussion as well as the skill in the art.

Looking in more detail to FIG. 8, the method 10 first step 12 attaches a circuit die 202 relative to a first surface $204_{S1}$ of a substrate 204, where again circuit die 202 may include apparatus and functionality for either transmitting or receiving (or both transmitting and receiving) a wave with bandwidth $BW_D$. Substrate 204 is constructed of various materials, but note with respect to wave device 200, in contrast to the earlier-described device 100, that the material of substrate 204 is not needed to be transmissive to bandwidth $BW_D$, as in this preferred embodiment the waves are not ultimately transmitted through that structure. In any event, the attachment of die 202 relative to substrate 204 may include various techniques and structure, where also in FIG. 8 such affixation is shown with a first lead frame 206 first attached to substrate 204, and circuit die 202 attached adjacent lead frame 206. While not shown from the cross-sectional perspective, note that additional lead frames also may be, and are likely to be, affixed to substrate 204, with conductors (e.g., bond wires) also connected between each such lead frame and respective conductive pads on die 202. Completing FIG. 8, step 14 of method 10 again forms a shaped sublimatable material relative to a region of circuit die 202, where in the illustrated example a sublimatable form 212 is created, and as illustrated has a stair-step profile. Note that form 212 may be created using various processes, including 3-D printing, by way of example, where again form 212 provides a precursor shape for forming an adjacent and shape-conforming structure next to the form, as further appreciated below.

Figure 9A:
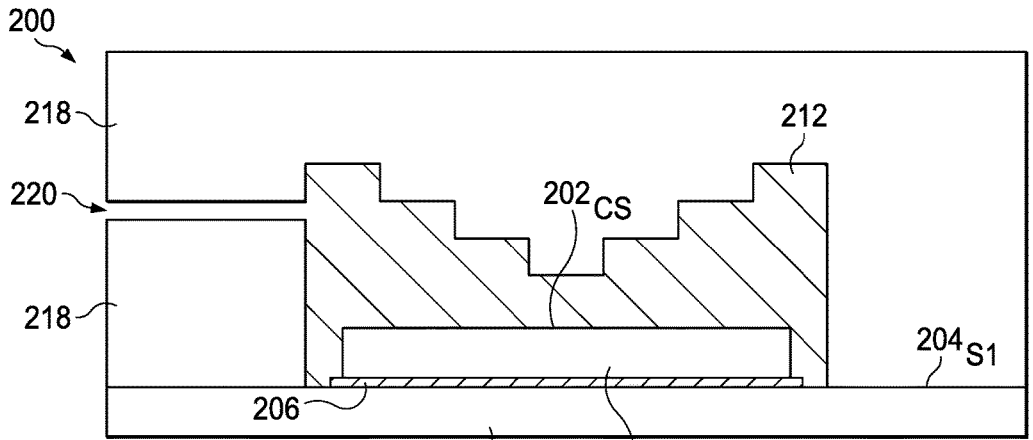
FIG. 9A illustrates the cross-sectional view of FIG. 8 after additional processing.

With respect to wave device 200, and as now introduced in the cross-sectional view of FIG. 9A, the FIG. 1 steps 16 and 18 are combined with respect to a single structure. More particularly, a conforming wave shaping member 218 (or plural members) is formed adjacent the sublimatable form 212, where in this preferred embodiment conforming wave shaping member 218 (step 16 of method 10) is an integrated circuit packaging material (step 18 of method 10) applied over the device, here preferably so as to encapsulate the sublimatable form 212 and the remainder of the items affixed to substrate 204. To illustrate this step, FIG. 9A illustrates the cross-sectional view of FIG. 8, with the addition of an encapsulating molding material that therefore provides a wave shaping member 218, formed according to step 18 by applying a select molding material over the desired circuit components and performing any additional steps as may be required in connection with integrated circuit packaging. As will be appreciated later, for the preferred embodiment device 200 of FIG. 9A (and later Figures), ultimately waves are to pass through the molding materials of member 218, akin to such waves passing through substrate 104 in the earlier device 100. Thus, for device 200, the molding materials(s) forming member 218 are selected with a consideration of the type and/or bandwidth $BW_D$ of the wave that is communicated relative to device 100, so that such materials readily permit the wave to transmit through member 218 with little or no change in the signal strength, that is, the molding material does not have strong absorbance in the bandwidth $BW_D$ of interest. Also in connection with FIG. 9A, a lateral aperture 220 in fluid (e.g., air) communication with the sublimatable form 212 is also created.

Figure 10:
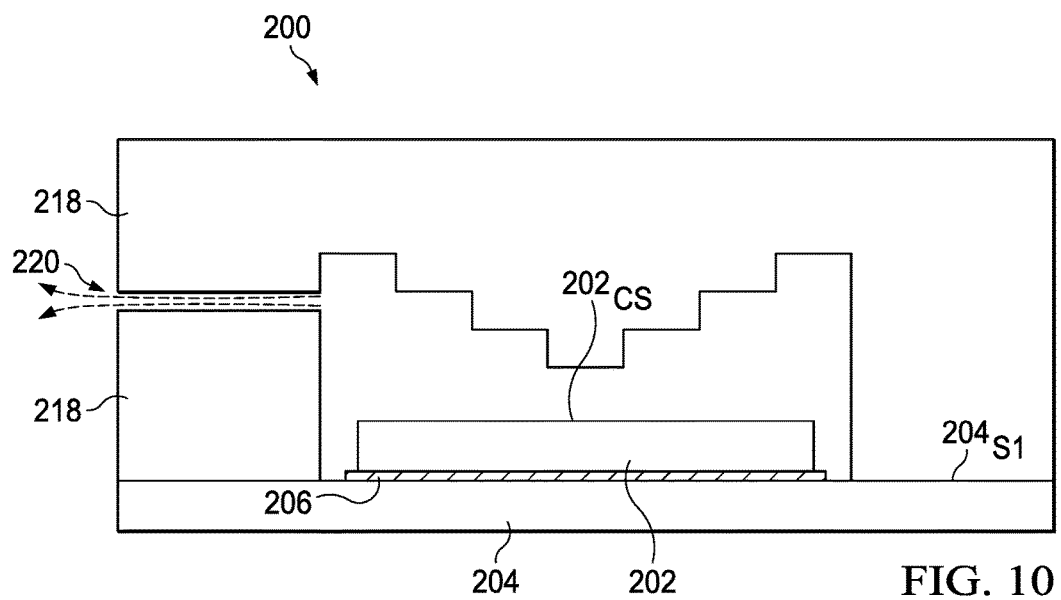
FIG. 10 illustrates the cross-sectional view of FIG. 9A after additional processing.

FIG. 10 illustrates the cross-sectional view from FIG. 9A, further demonstrating step 20 of method 10, as applied to device 200. Thus, FIG. 10 depicts that sublimatable form 212 from FIG. 9A is sublimated, again by process(es) to transition the substance directly from the solid to the gas phase without passing through the intermediate liquid phase. Hence, the sublimatable material encapsulated by encapsulating mold 218 turns to gas and is exhausted via aperture 220, as shown by dotted arrows in the Figure. Again, therefore, a device (200) results in which an interior cavity remains relative to the surface of circuit die 212 and in which waves may propagate with little or no interference from the air in that cavity.

Figure 11:
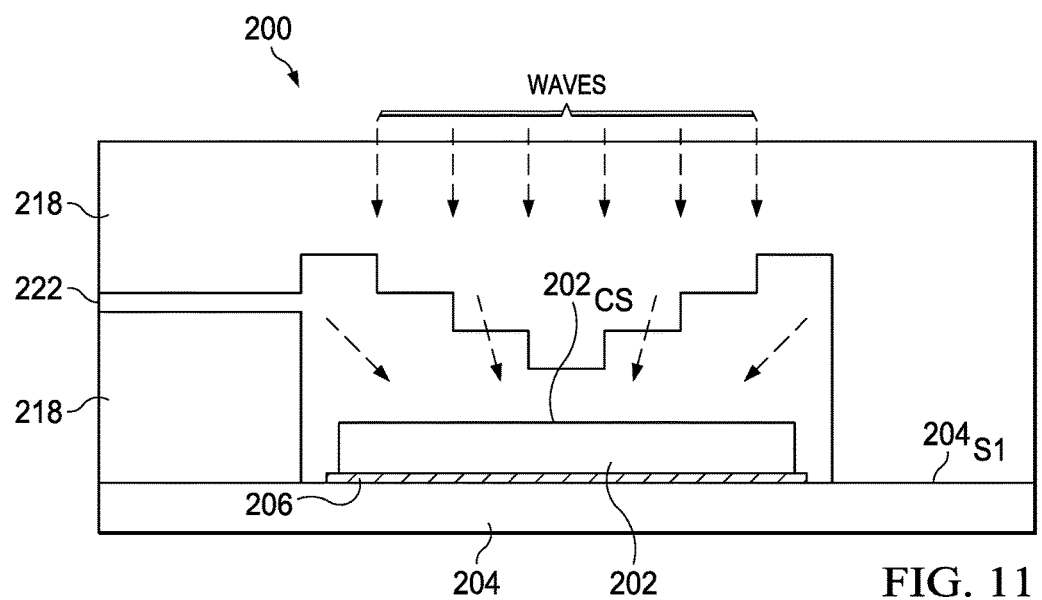
FIG. 11 illustrates the cross-sectional view of FIG. 10 after additional processing and in an operational illustration.

FIG. 11 illustrates the cross-sectional view from FIG. 10, further demonstrating steps 22 and 24 of method 10, as applied to device 200. As a first observation in FIG. 11, a cover 222 may be formed over the aperture 220 that was formerly in the packaging material, as shown in FIG. 10. Thus, cover 222 encloses any open cavity between encapsulating mold 218 and circuit die 202. As a second observation in FIG. 11, the final step 24 from FIG. 1 is shown in FIG. 11 to process waves. Recall that mold 218 comprises materials that readily permit the wave to transmit through it, with little or no change in the signal direction or strength. As a result, in FIG. 11, such waves are shown directed toward, and passing through, mold 218. Note, however, that the stair-step shape of mold 218 presents a surface facing circuit die 202 and that thereby creates a refractive directionality of the waves, so as to focus or direct the waves more toward the communication surface $202_{CS}$ of die 202. In this regard, therefore, mold 218, either alone or in combination with the air interface from the cavity left behind after sublimation of form 212, again provides wave shaping directionality of the waves toward circuit die 202 (or, in an alternative preferred embodiment whereby die 202 includes a transmitter, such directionality may be achieved away from circuit die 202). In any event, therefore, mold 218 provides a lens so as to change the direction of waves impinging on a first surface of the lens relative to the waves as they depart from a second surface of the lens.

Figure 9B:
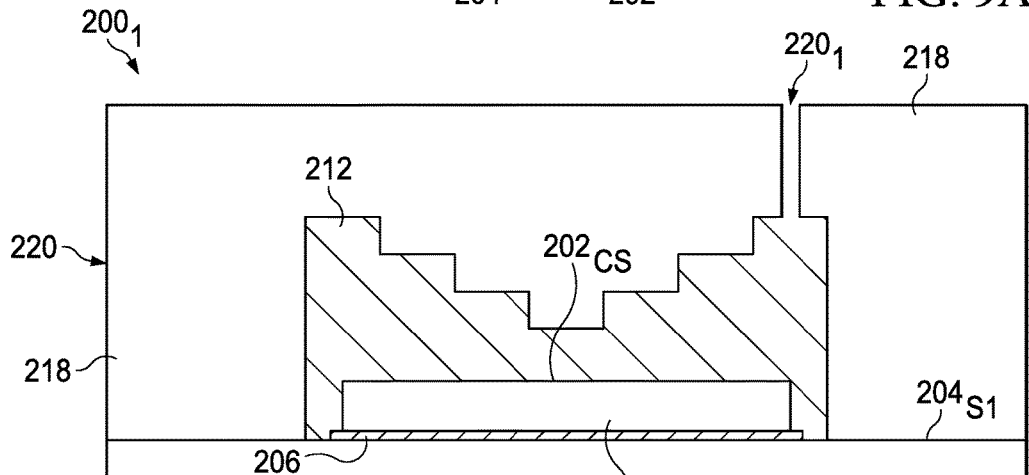
FIGS. 9B and 9C illustrate respective cross-sectional views of alternative preferred embodiments to that shown in FIG. 9A.
Figure 9C:
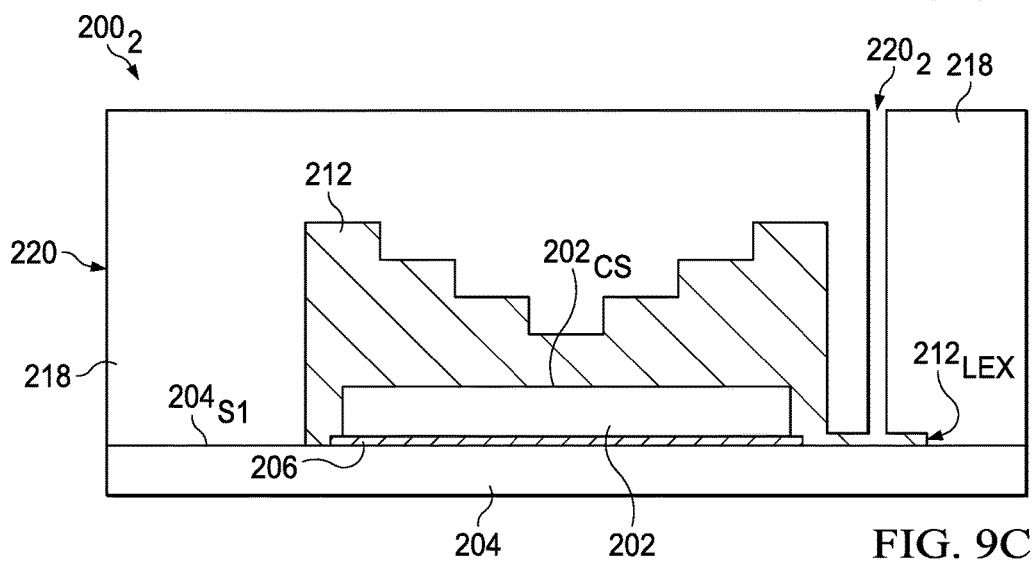

Having described the formation of device 200 and its operation, various alternatives are contemplated, and as examples additional devices $200_1$ and $200_2$ are shown, respectively, in FIGS. 9B and 9C, where the process flow in those Figures is comparable to the stage of formation as discussed earlier in connection with FIG. 9A. By way of introduction to both devices $200_1$ and $200_2$, it is recognized in connection with device 200 of FIG. 9A that a laterally created aperture 220 may be difficult, infeasible, or otherwise undesirable during certain process flows. As alternatives, therefore, devices $200_1$ and $200_2$ both include vertical apertures $220_1$ and $200_2$, respectively, as may be implemented in connection with both conventional molding processes as well as with the above-described film assist molding approach. In device $200_1$, vertical aperture $220_1$ is positioned toward a far (e.g., right, as shown) vertical edge of sublimatable form 212, so as to serve the exhausting function described above, while still permitting a vertical implementation of the aperture through the integrated circuit packaging material wave shaping member 218. Note this positioning is desirable in that it reduces the effect, if any, that the remaining bore of the aperture could have on disturbing the path of waves to/from device $200_1$. However, as an additional preferred embodiment, FIG. 9C illustrates for device $200_2$ that form 212 includes a lateral extension $212_{LEX}$, so as to provide a path for aperture $220_2$ to be positioned even a greater distance laterally relative to communication surface $202_{CS}$. Thus, once aperture $220_2$ is closed (akin to cover 222 in FIG. 11) and device $200_2$ is subsequently operated, waves are less likely to be disturbed as emitted or detected by circuit 202, due to the additional lateral displacement accomplished via lateral extension $212_{LEX}$.

From the above, various preferred embodiments provide improvements to a method of creating, and a resulting, integrated circuit wave device that communicates waves with a bandwidth that is minimally affected as the waves pass through an external portion of the device and are shaped internally of the device either to or from an encapsulated integrated circuit die. Preferred embodiments may be created for waves of various bandwidths, with radio frequency (RF), visible light and infrared (IR) communication elements as contemplated examples. Directionality and/or focus also may be used to a central point or to multiple points, the latter being achieved, for example, with an array of sensors or transmitters. Further, such internal wave shaping is achieved by creating a form and an adjacent shape, where the form is thereafter sublimated leaving behind an air cavity and a wave shaping member or the form is of a material that has at most a negligible effect on the bandwidth $BW_D$ of the waves passing through it. The wave shaping member may take many forms, such as lenses (e.g., Fresnel) or reflector shapes, where the shaping device may include singular or multiple such devices. Moreover, different preferred embodiments may be created for different respective bandwidths $BW_D$, and the device may thereby provide, or be incorporated into, numerous apparatus or applications, such as photodetctors/photosensors, cameras, range finders, focusing devices, targeting systems, automotive detectors, and numerous others, as will be ascertainable by one skilled in the art, having had the benefit of the teachings of this document. Thus, the preferred embodiments have been shown to have numerous benefits, and various embodiments have been provided. Accordingly, while various alternatives have been provided according to the disclosed embodiments, still others are contemplated and yet others may be ascertained by one skilled in the art. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. A method of forming an integrated circuit wave device, comprising: affixing an integrated circuit die relative to a substrate;
    creating a form relative to the integrated circuit die and the substrate, the form comprising a sublimatable material covering the integrated circuit die and at least a portion of the substrate;
    forming a wave shaping member over the form so that an inner surface of the wave shaping member that faces the integrated circuit die has a shape conforming at least in part to a shape of the form, and so that the wave shaping member has an aperture, wherein the wave shaping member comprises a lens comprising integrated circuit packaging material; and
    sublimating the sublimatable material so as to exhaust gas through the aperture.

2. The method of claim 1:
    wherein the wave shaping member is operable to shape a wave comprising a bandwidth; and wherein the step of creating a form comprises creating the form comprising a material with at most a negligible effect on the bandwidth.

3. The method of claim 1 wherein the step of forming a wave shaping member comprises forming a reflector.

4. The method of claim 1 wherein the step of forming a wave shaping member comprises forming the wave shaping member adjacent the form.

5. The method of claim 4 and further comprising forming an encapsulating integrated circuit packaging material adjacent the wave shaping member.

6. The method of claim 5:
    wherein the step of forming an encapsulating integrated circuit packaging material comprises forming the encapsulating integrated circuit packaging material having an aperture.

7. The method of claim 6 and further comprising sealing the aperture after the sublimating step.

8. The method of claim 1: wherein the wave shaping member is operable to shape a wave comprising a bandwidth; and
    wherein the substrate comprises a material with at most a negligible effect on the bandwidth.

9. The method of claim 1:
    wherein the step of forming a lens from integrated circuit packaging material comprises forming the integrated circuit packaging material having the aperture.

10. The method of claim 1 wherein the step of forming the wave shaping member comprises forming a path comprising the aperture, wherein the path is laterally displaced from a side edge of the sublimatable material.

11. The method of claim 1 wherein the step of creating a form comprises creating a form comprising a stair-step profile.

12. The method of claim 1 wherein the step of creating a form comprises 3D printing the form.

13. The method of claim 1:
wherein the wave shaping member is operable to shape a wave comprising a bandwidth; and wherein the bandwidth comprises a radio frequency bandwidth.

14. The method of claim 1:
wherein the wave shaping member is operable to shape a wave comprising a bandwidth; and wherein the bandwidth comprises an infrared bandwidth.

15. The method of claim 1:
wherein the wave shaping member is operable to shape a wave comprising a bandwidth; and wherein the bandwidth comprises visible light bandwidth.

16. The method of claim 1:
wherein the wave shaping member is operable to shape a wave comprising a bandwidth; and wherein the bandwidth comprises ultraviolet bandwidth.

17. The method of claim 1 wherein the integrated circuit comprises a transmitter or receiver.

18. The method of claim 1, wherein the inner surface defines an interior cavity that is substantially filled by the form.

19. The method of claim 1, wherein the inner surface is concave relative to the integrated circuit die.

20. An integrated circuit wave device, comprising:
an integrated circuit die affixed to a substrate; and
a wave shaping member disposed over the integrated circuit die and having an inner surface facing the integrated circuit die, the inner surface conforming at least in part to a shape of a form that was affixed to the substrate during manufacture of the integrated circuit wave device, wherein the inner surface defines an interior cavity formed by exhausting sublimated gas through an aperture of the wave shaping member, wherein the wave shaping member comprises a lens comprising integrated circuit packaging material, and the integrated circuit die is affixed to the substrate within the interior cavity.

21. The integrated circuit wave device of claim 20, wherein the interior cavity separates the integrated circuit die from the inner surface.

\* \* \* \* \*